United States Patent
Horak et al.

(10) Patent No.: US 8,084,311 B1
(45) Date of Patent: Dec. 27, 2011

(54) METHOD OF FORMING REPLACEMENT METAL GATE WITH BORDERLESS CONTACT AND STRUCTURE THEREOF

(75) Inventors: David V. Horak, Essex Junction, VT (US); Su Chen Fan, Cohoes, NY (US); Theodorus E. Standaert, Pine Bush, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/948,246

(22) Filed: Nov. 17, 2010

(51) Int. Cl.
*H01L 21/338* (2006.01)
*H01L 21/336* (2006.01)

(52) U.S. Cl. .................... 438/183; 438/257; 438/926

(58) Field of Classification Search .................... None
See application file for complete search history.

(56) References Cited

U.S. PATENT DOCUMENTS

| | | | |
|---|---|---|---|
| 6,531,724 B1 | 3/2003 | Furukawa et al. | |
| 6,534,389 B1 | 3/2003 | Ference et al. | |
| 6,613,624 B2 | 9/2003 | Wurzer | |
| 6,878,597 B2 | 4/2005 | Kim | |
| 7,544,594 B2 | 6/2009 | Change | |
| 7,659,171 B2 | 2/2010 | Furukawa et al. | |
| 7,804,130 B1 * | 9/2010 | Fung | 257/330 |
| 2002/0132191 A1 | 9/2002 | Chuang | |
| 2005/0260808 A1 * | 11/2005 | Chen et al. | 438/197 |
| 2006/0148182 A1 | 7/2006 | Datta et al. | |
| 2010/0001369 A1 | 1/2010 | Chuang et al. | |

* cited by examiner

*Primary Examiner* — Ha Tran T Nguyen
*Assistant Examiner* — Valerie N Brown
(74) *Attorney, Agent, or Firm* — Yuanmin Cai

(57) ABSTRACT

Embodiments of the present invention provide a method of forming borderless contact for transistor in a replacement metal gate process. The method includes forming a gate on top of a substrate and forming spacers adjacent to sidewalls of the gate; lowering height of the spacers to expose a top portion of the sidewalls of the gate; depositing an etch-stop layer covering the spacers and the upper portion of the sidewalls of the gate; making an opening at a level that is above the spacers and in the upper portion of the sidewalls to expose the gate; and replacing material of the gate from the opening with a new gate material thereby forming a replacement gate. The method further creates a via opening in an inter-level dielectric layer surrounding the gate and spacers, with the via opening exposing the etch-stop layer; removing the etch-stop layer and fill the via opening with a metal material to form borderless contact.

20 Claims, 6 Drawing Sheets

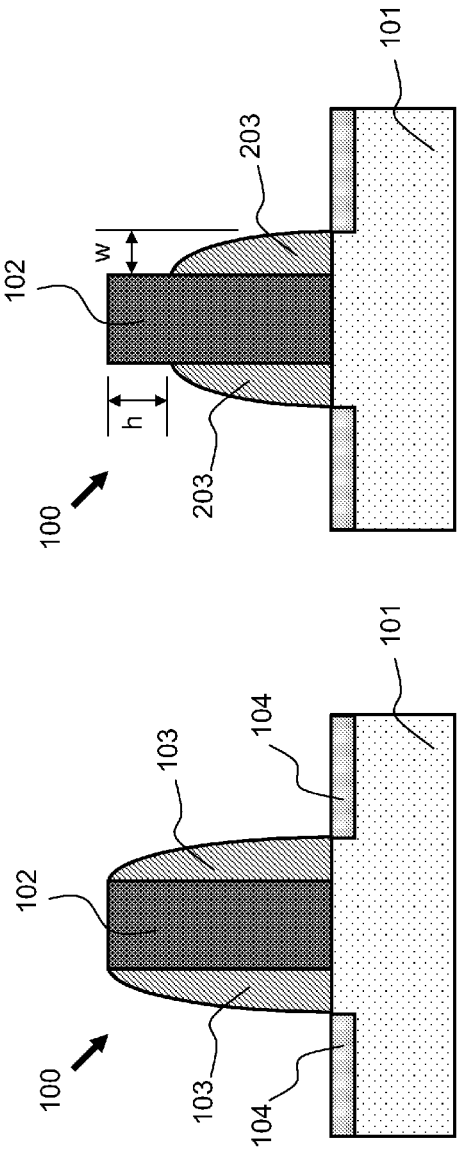

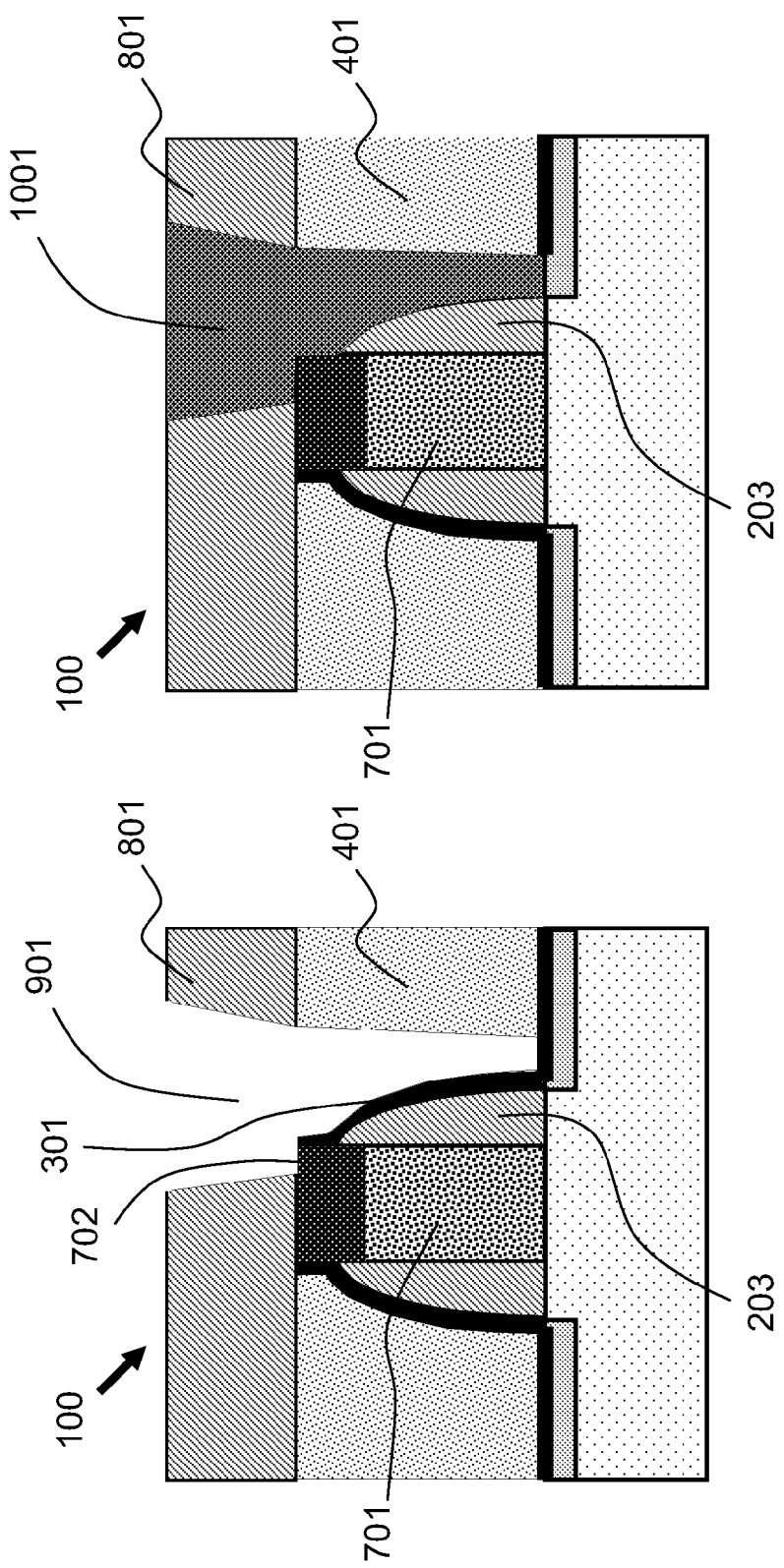

METHOD OF FORMING REPLACEMENT METAL GATE WITH BORDERLESS CONTACT AND STRUCTURE THEREOF

FIELD OF THE INVENTION

The present invention relates generally to the field of semiconductor device manufacturing and in particular relates to method of forming replacement metal gate with borderless contact.

BACKGROUND OF THE INVENTION

In the field of semiconductor device manufacturing, active semiconductor devices such as, for example, transistors are generally manufactured or fabricated through processes commonly known as front end of line (FEOL) technologies. A transistor may be, for example, a field-effect-transistor (FET) and may be more specifically a complementary metal-oxide-semiconductor (CMOS) FET. A FET may also be a p-type dopant doped PFET or an n-type dopant doped NFET. Recently, high-k metal gate (HKMG) semiconductor transistors have been introduced because of their superior performance over conventional poly-based CMOS-FET. In addition, a replacement metal gate (RMG) process has been developed to further enhance the performance of HKMG transistors.

Generally, after structure of a transistor is formed, conductive contacts are formed to connect to source, drain, and/or gate of the transistor to make the transistor fully functional. With the continuous scaling down in device dimension in integrated circuitry, real estate for forming corresponding contacts is also becoming smaller and smaller. As a result, contacts that are borderless to gate, which generally requires less real estate and have been used for a while in dynamic random access memory (DRAM), are making their way into logic structures such as transistors.

As is known in the art, in order to form borderless contacts for a transistor that is manufactured through a non-replacement metal gate (non-RMG) process, normally a $HfO_2$ layer or other types of highly RIE (reactive-ion-etching) resistant etch-stop layer is formed or deposited to cover the gate stack of the transistor before depositing the CA inter-layer dielectric. Metal contacts are then formed next to the etch-stop layer to be borderless to the gate. However, despite demonstrated feasibility of the above approach for transistors made by various non-RMG processes, technical difficulties have been met in trying to integrate the above approach into the RMG process. In particular, when applying the above approach to form borderless contacts in a RMG process, the top portion of spacers that are formed next to the gate will inevitably become compromised during the RMG process, particularly in a polishing step that is used to open up the gate area in order to remove the dummy gate therein.

For example, FIG. 11 demonstratively illustrates a semiconductor structure during a process of forming borderless contacts for a transistor as is known in the art. More specifically, during the process of forming transistor 1100, a gate stack such as metal gate 1101 may be first formed on top of a semiconductor substrate 1102. Spacers such as nitride spacers 1103 may be formed adjacent to metal gate 1101 at sidewalls thereof. After forming silicide in source and drain regions 1104 next to nitride spacers 1103 in substrate 1102, a $HfO_2$ layer 1105, or other types of etch-stop layer, may be deposited to cover both metal gate 1101 and spacers 1103. Next, as is known in the art, a dielectric layer 1106 is deposited to cover source and drain regions 1104 and metal gate 1101, and subsequently contact or via holes (not shown) are created inside dielectric layer 1106. The contact holes may be formed right next to, and bordering, etch-stop layer 1105 with the help of etch-selectivity of etch-stop layer 1105. Finally, borderless contacts may then be formed for transistor 1100 by filling the contact holes with appropriate conductive or metal material.

However, the above approach commonly used in a non-RMG process may not be directly applied to, or easily combined with, a RMG process. For example, in a RMG process, metal gate 1101 as shown in FIG. 11 may be a dummy gate 1201 illustrated in FIG. 12, which needs to be removed and then replaced or re-formed with same or other appropriate metal material. Dummy gate 1201 may be made of metal or poly-silicon or other materials. In order to perform replacement of dummy gate 1201, following the step illustrated in FIG. 11, the gate region will be opened by removing a top portion of dummy gate 1201 through, for example, a chemical-mechanic-polishing (CMP) process to expose dummy gate 1201. Unfortunately, the process of removing and exposing dummy gate 1201 may at the same time removes a top portion of spacers 1103 that are adjacent to dummy gate 1201, creating a top surface 1207 that causes spacers 1203 to be exposed as well without the covering of etch-stop layer 1105. The exposed spacers 1103 are vulnerable to subsequent reactive-ion-etching (RIE) processes, after the formation of replacement metal gate, employed to create contact holes. Therefore, addition protective layer may need to be formed, which needs to be compatible with the replacement gate process, to cover and protect spacers 1103. In certain situations, borderless CA contacts may not even be achievable with the above RMG process.

SUMMARY OF EMBODIMENTS OF THE INVENTION

Embodiments of the present invention provide a method of forming a semiconductor structure such as, for example, a field-effect-transistor with replacement metal gate. The method may include forming a gate, on top of a substrate, and spacers adjacent to sidewalls of the gate; lowering a height of the spacers to expose an upper portion of the sidewalls of the gate; depositing an etch-stop layer covering the height-lowered spacers and the exposed upper portion of the sidewalls of the gate; creating an opening at a level above the spacers and within the upper portion of the sidewalls to expose the gate from a top thereof; and removing existing gate material of the gate from the opening and replacing with a new gate material to form a replacement gate.

According to one embodiment, creating the opening may include depositing a first inter-level dielectric (ILD) layer covering the height-lowered spacers and at least a portion of the exposed upper portion of the sidewalls of the gate; and lowering a top surface of the first ILD layer through planarization to the level thereby removing the etch-stop layer from a top surface of the gate and creating the opening.

In one embodiment, the method may further include depositing a second ILD layer covering the replacement gate and the first ILD layer; creating an via opening in the first and second ILD layers, the via opening exposing the etch-stop layer, the etch-stop layer covering the spacers and the upper portion of the sidewalls of the gate; removing at least a portion of the exposed etch-stop layer that is on top of a source/drain region; and filling the via opening with a metal material forming a metal contact.

In another embodiment, the new gate material is covered by a gate cap layer at a top thereof that protects the replacement gate during the process of the creating the via opening in the first and second ILD layers. In a further embodiment, the gate cap layer may be aluminum-oxide, aluminum-nitride, or dielectric material that is different from the second ILD layer.

According to one embodiment, depositing the first ILD layer may include depositing the first ILD layer to fully cover the exposed upper portion of the sidewalls and the top surface of the gate through the etch-stop layer. The upper portion of the sidewalls of the gate may have a range of height between about 5 nm and about 35 nm, representing about 10% to 70% of a total height of the gate, the range of height being adequate for causing the opening to be created at the level above the spacers.

In one embodiment, lowering a height of the spacers may include etching the spacers in a reactive-ion-etching (RIE) process, with the RIE process being a directional etching process and being selective to the existing gate material of the gate.

BRIEF DESCRIPTION OF THE DRAWINGS

The present invention will be understood and appreciated more fully from the following detailed description of preferred embodiments, taken in conjunction with the accompanying drawings of which:

FIG. 1 is a demonstrative illustration of a method of forming transistors with replacement metal gate and borderless contacts according to an embodiment of the present invention;

FIG. 2 is a demonstrative illustration of a method of forming transistors with replacement metal gate and borderless contacts, following the step illustrated in FIG. 1, according to an embodiment of the invention;

FIG. 9 is a demonstrative illustration of a method of forming transistors with replacement metal gate and borderless contacts, following the step illustrated in FIG. 8, according to an embodiment of the invention;

FIG. 10 is a demonstrative illustration of a method of forming transistors with replacement metal gate and borderless contacts, following the step illustrated in FIG. 9, according to an embodiment of the invention;

Figure 4:
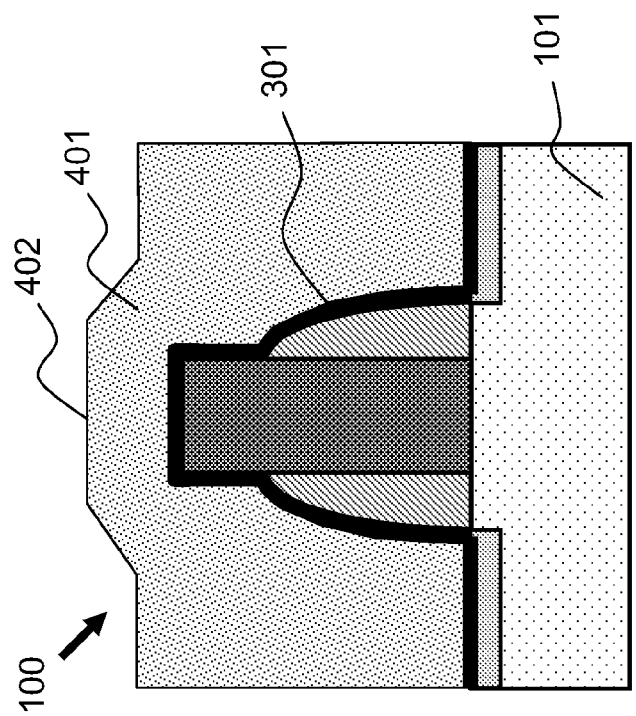
FIG. 4 is a demonstrative illustration of a method of forming transistors with replacement metal gate and borderless contacts, following the step illustrated in FIG. 3, according to an embodiment of the invention.

It will be appreciated that for the purpose of simplicity and clarity of illustration, elements in the drawings have not necessarily been drawn to scale. For example, dimensions of some of the elements may be exaggerated relative to those of other elements for clarity purpose.

DETAILED DESCRIPTION OF THE INVENTION

In the following detailed description, numerous specific details are set forth in order to provide a thorough understanding of various embodiments of the invention. However, it is to be understood that embodiments of the invention may be practiced without these specific details.

In the interest of not obscuring presentation of essences and/or embodiments of the invention, in the following detailed description, some processing steps and/or operations that are known in the art may have been combined together for presentation and/or for illustration purpose and in some instances may have not been described in detail. In other instances, some processing steps and/or operations that are known in the art may not be described at all. In addition, some well-known device processing techniques may have not been described in detail and, in some instances, may be referred to other published articles, patents, and/or published patent applications for reference in order not to obscure description of essence and/or embodiments of the invention. It is to be understood that the following descriptions may have rather focused on distinctive features and/or elements of various embodiments of the invention.

FIG. 1 is a demonstrative illustration of a method of forming transistors with replacement metal gate and borderless contact according to an embodiment of the present invention. More specifically, the method may include forming a transistor 100 on top of a substrate 101. Substrate 101 may be any semiconductor substrate that is suitable for forming transistors thereupon such as, for example, a silicon substrate, a germanium-doped silicon substrate, a strained silicon substrate, a substrate with buried oxide (BOX), or a strained silicon directly on insulator (SSDOI). Other types of substrate may be used as well. The method may form transistor 100 to include a gate structure having a dummy gate 102 and spacers 103 adjacent to dummy gate 102 to cover sidewalls thereof. In general, spacers 103 are formed through, for example, a directional etching process of a conformal dielectric layer being deposited on top of dummy gate 102, and therefore have a height that is the same as that of dummy gate 102. In other words, sidewalls of dummy gate 102 may be fully covered by spacers 103. Transistor 100 may also include source and drain regions 104 that are formed next to spacers 103.

In order not to obscure description and/or illustration of essence of the present invention, some well known features and elements of transistor 100 may not be shown in the drawings nor described below in detail. For example, a gate dielectric layer is normally formed underneath dummy gate 102 but is not shown in FIG. 1, neither are some of other well-known transistor elements. For instance, source/drain extensions of transistor 100 may be formed in substrate 101 underneath and/or adjacent to spacers 103 but they are not shown in FIG. 1 either.

According to one embodiment of the present invention, the formation of source/drain 104, and source/drain extensions, may be made at a later stage of the process. A person skilled in the art will appreciate that embodiment of the present invention may not necessarily depend upon certain specific orders of steps that different elements of transistor 100 are formed and may be exercised in other suitable alternate orders. For the below description purpose, it is assumed that source/drain regions 104 and related source/drain extensions of transistor 100 are already formed inside substrate 101.

FIG. 2 is a demonstrative illustration of a method of forming transistors with replacement metal gate and borderless contact, following the step illustrated in FIG. 1, according to an embodiment of the present invention. In particular, the method includes reducing height of spacers 103 below a top surface of dummy gate 102, and as a result exposing a portion of sidewalls of dummy gate 102. The pull-down of spacers 103 may be carried out in a selective directional etching process, such as a reactive-ion-etching (RIE) process that may be made and/or chemically adjusted to be selective to material of dummy gate 102. As a result of this selective etching process, only top portion of sidewalls 103 may be etched away and dummy gate 102 remains intact or substantially intact.

In the meantime, even though the etching process may be directional, the pull-down process of spacers 103 may nevertheless cause the width of spacers 103 to shrink or be narrowed to certain extent. Therefore, caution need to be exercised to ensure that the final (after pull-down process) width "w" of the pulled down spacers 203 is sufficiently wide to protect the source/drain extensions from leaking current. Such caution may include, for example, forming spacers 103 initially to have slightly wider width than they are necessarily needed to pre-compensate potential narrowing-down during the spacer height pull-down process. Additionally, the height of the portion of dummy gate 102 whose sidewalls are exposed, known here as a pull-down height "h", is generally not a concern since the sidewalls will be covered by a RIE resistant layer, which may be more RIE resistant than material of spacer 203, for adequate protection and insulation from conditions of a later contact RIE etching process, as being described later in more details.

Figure 3:
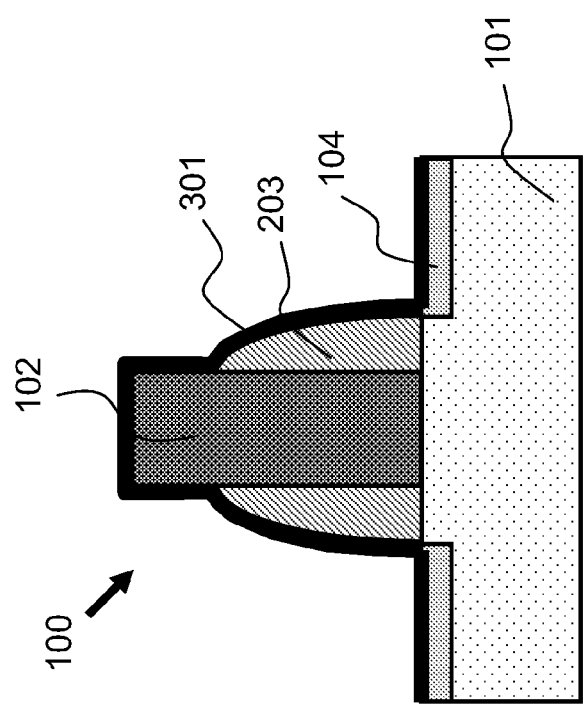
FIG. 3 is a demonstrative illustration of a method of forming transistors with replacement metal gate and borderless contacts, following the step illustrated in FIG. 2, according to an embodiment of the invention.

FIG. 3 is a demonstrative illustration of a method of forming transistors with replacement metal gate and borderless contact, following the step illustrated in FIG. 2, according to an embodiment of the present invention. After the spacer height pull-down process, an etch-stop layer 301 may be formed or deposited over dummy gate 102, the exposed sidewalls thereof, and the pulled down spacers 203. The etch-stop layer 301 may be formed in order to facilitate subsequent steps of creating contact holes in a dielectric layer deposited over spacers 203 without causing a replacement gate (to be formed later) and spacers 203 to be eroded or etched away by the process. For example, if a RIE process is used later to create contact holes in the dielectric layer (which are described below in more details), the etch-stop layer 301 shall be made of a material that is different from the dielectric material (to be deposited thereupon) such that the RIE process may be made selective to the etch-stop layer 301. In other words, suitable etch-stop layer material that is resistant to the RIE process shall be used. As some non-limiting examples, hafnium-oxide layer in the form of $HfO_2$, molecular layer deposition nitride, CVD $Al_2O_3$ and/or $Ta_2O_5$ layer, and Yttrium oxide layer may be used as an etch-stop layer during the process, for example, to be blank deposited to cover dummy gate 102 and sidewalls thereof, spacers 203 which may be nitride spacers, and source/drain regions 104 in substrate 101.

FIG. 4 is a demonstrative illustration of a method of forming transistors with replacement metal gate and borderless contact, following the step illustrated in FIG. 3, according to an embodiment of the present invention. After dummy gate 102, spacers 203 and surrounding areas are covered by etch-stop layer 301, an inter-layer dielectric layer (ILD) 401 may be deposited to cover source/drain regions 104, sidewall spacers 203, and at least a portion of the exposed sidewalls of dummy gate 102 which are all now covered by etch-stop layer 301. In one embodiment, the entire dummy gate 102 (top surface and sidewalls) is covered by ILD layer 401. For example, ILD layer 401 may be deposited to have a height, measured from the surface of substrate 101, which is at least higher than that of the pulled-down spacers 203. Preferably, but not necessarily, ILD layer 401 may be deposited to have a height higher than that of dummy gate 102.

Figure 5:
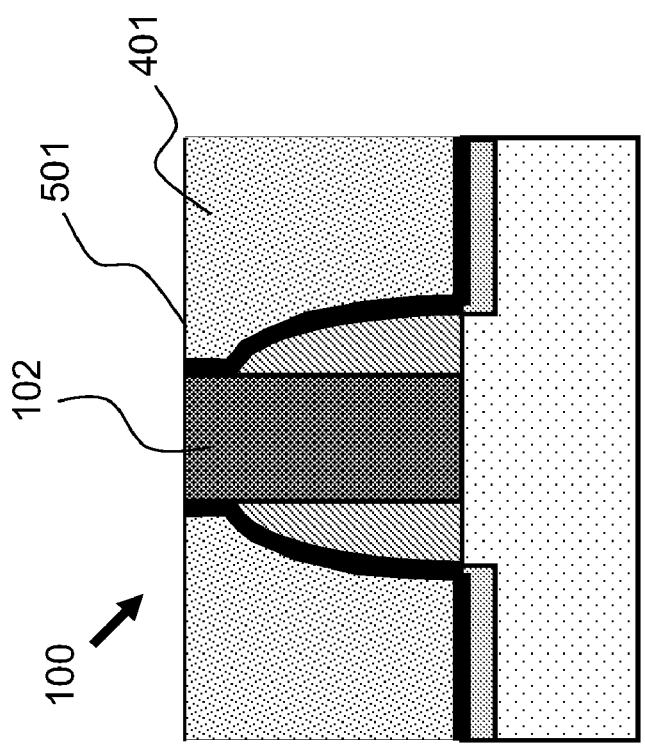
FIG. 5 is a demonstrative illustration of a method of forming transistors with replacement metal gate and borderless contacts, following the step illustrated in FIG. 4, according to an embodiment of the invention.

FIG. 5 is a demonstrative illustration of a method of forming transistors with replacement metal gate and borderless contact, following the step illustrated in FIG. 4, according to an embodiment of the present invention. After ILD layer 401 has been deposited to cover at least partially dummy gate 102, embodiment of the method includes applying a chemical-mechanic-polishing process to planarizing ILD layer 401 until etch-stop layer 301 on top dummy gate 102 is removed thereby exposing dummy gate 102 underneath thereof. According to one embodiment, this planarizing process may be carefully controlled to stop when dummy gate 102 is exposed after etch-stop layer 301 thereupon is removed but before the top of pulled-down spacers 203 is reached. In other words, the planarizing process may create a top surface 501 that situates within the range of pull-down height "h". For example, in one embodiment, the pull-down height "h" may be between about 5 nm and about 35 nm for a field-effect-transistor of having a total gate height about 50 nm. A pull-down height of above range ensures that there is enough margin for the top surface 501 of ILD layer 401 to settle within the pull-down height.

Figure 6:
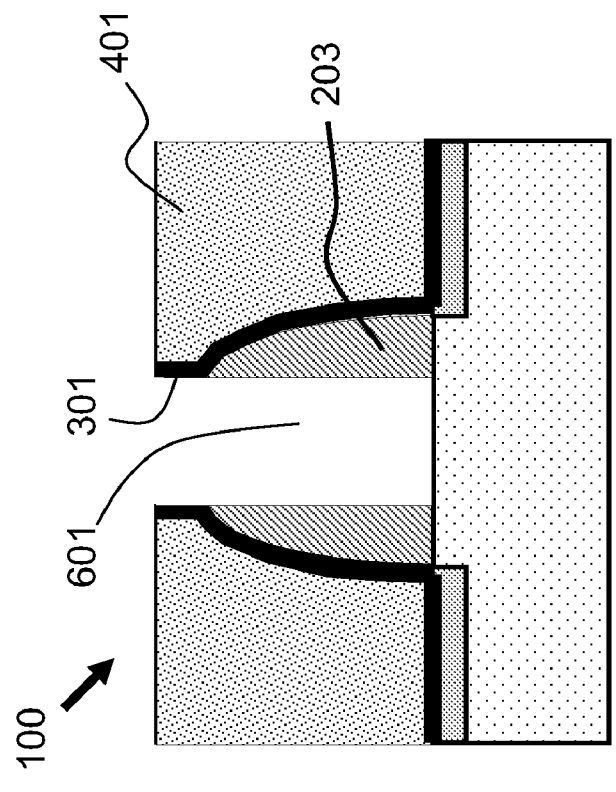
FIG. 6 is a demonstrative illustration of a method of forming transistors with replacement metal gate and borderless contacts, following the step illustrated in FIG. 5, according to an embodiment of the invention.

FIG. 6 is a demonstrative illustration of a method of forming transistors with replacement metal gate and borderless contact, following the step illustrated in FIG. 5, according to an embodiment of the present invention. After dummy gate 102 is exposed through the CMP process, embodiment of the present invention continues with a step of removing dummy gate 102, thereby creating an opening 601 above the gate region of substrate 101. According to one embodiment of the invention, the upper portion of opening 601 may be lined with etch-stop layer 301 while a lower portion is surrounded by pulled down spacers 203. In other words, there is nowhere of opening 601 that is directly exposed to ILD layer 401.

Figure 7:
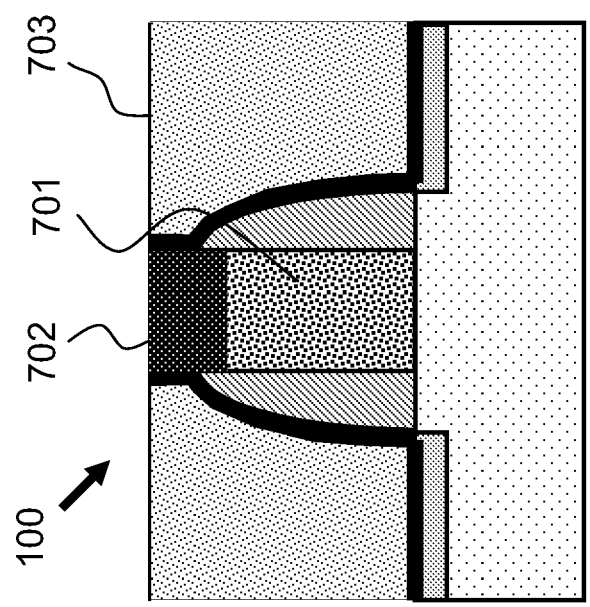
FIG. 7 is a demonstrative illustration of a method of forming transistors with replacement metal gate and borderless contacts, following the step illustrated in FIG. 6, according to an embodiment of the invention.

FIG. 7 is a demonstrative illustration of a method of forming transistors with replacement metal gate and borderless contact, following the step illustrated in FIG. 6, according to an embodiment of the present invention. After dummy gate 102 is removed creating opening 601, a replacement gate 701 may be formed in the opening 601. A variety of candidate metal materials, for example, aluminum (Al) and/or tungsten (W) or a combination of different conductive materials may be used for replacement gate 701 and may be formed by methods known in the art. For example, aluminum may be deposited in opening 601 through a sputtering process followed by a thermal annealing process to "reflow" the deposited aluminum. The thermal annealing process generally improves the gap-filling capacity of aluminum and eliminates the formation of voids. Preferably, before filling opening 601 with conductive materials, liners such as hafnium-oxide may be formed around bottom and inner sidewalls of opening 601 to prevent possible diffusion of gate materials (formed therein later) into channel regions underneath the gate and/or into spacers. After the deposition of gate metal, excess of the metal on top of the gate may be removed by applying, for example, a chemical-mechanic-polishing (CMP) process.

In one embodiment, the metal material used in filling opening 601 to form metal gate 701 may be preferably self-oxidized at its top surface to form an oxide layer 702 that is, similar to etch-stop layer 301, highly resistant to the RIE process being used later to create contact holes in ILD layer 401. For example, aluminum (Al) may be used as a replacement metal gate material. A gate cap may be formed at the top of the aluminum gate material such as, for example, an Al-oxide, a nitride cap layer, or other suitable capping layer that is different material from dielectric material 401. In the case that an Al-oxide cap layer is used, the aluminum gate material 701 may be self-oxidized, in room-temperature atmosphere, to form $Al_2O_3$ to have an appropriate depth of about 3 nm or more. The thickness may be bigger than the sidewalls of previously opened gate to be below the height of spacer 203. An oxygen plasma treatment may be used to form thick Al-oxide cap layer. For example, the oxygen plasma treatment may grow Al-oxide up to 50 nm in thickness in less than 20 minutes. Cap layers of other materials such as nitride or dielectric may be formed through well-known damascene technique.

Figure 8:
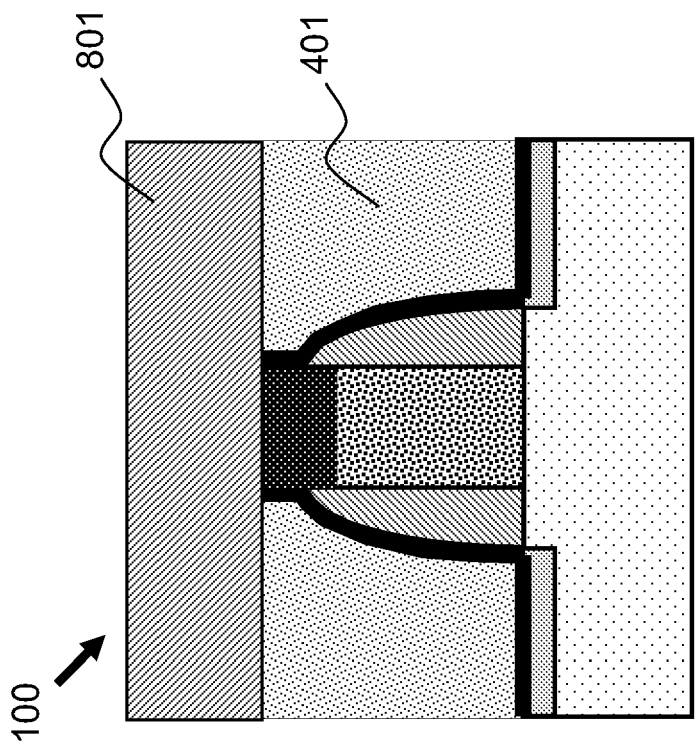
FIG. 8 is a demonstrative illustration of a method of forming transistors with replacement metal gate and borderless contacts, following the step illustrated in FIG. 7, according to an embodiment of the invention.

FIG. 8 is a demonstrative illustration of a method of forming transistors with replacement metal gate and borderless contact, following the step illustrated in FIG. 7, according to an embodiment of the present invention. After the formation of replacement metal gate 701 and the etch-resistant top layer 702, another inter-level dielectric (ILD) layer 801, which may be same or different from ILD layer 401, may be deposited on top of replacement gate 701 and ILD layer 401. Contacts and/or interconnects may be formed both inside ILD layers 401 and 801 as being described below in more details.

FIG. 9 is a demonstrative illustration of a method of forming transistors with replacement metal gate and borderless contact, following the step illustrated in FIG. 8, according to an embodiment of the present invention. During this step, one or more contact holes may be created to reach contact points such as silicide in the source and/or drain regions 104 of transistor 100. For example, a contact hole 901 may be created by applying a selective etching process such as a RIE process, as being discussed above. The etching of contact hole or opening 901 may be stopped by etch-stop layer 301 bordering spacers 203 and portion of sidewalls of replacement gate 701. In one embodiment, contact hole 901 may also expose portion of top surface 702 of replacement gate 701. Since replacement gate 701 is covered by the etch-resistant aluminum-oxide $Al_2O_3$, over-etch of replacement gate 701 may be kept at minimum.

FIG. 10 is a demonstrative illustration of a method of forming transistors with replacement metal gate and borderless contact, following the step illustrated in FIG. 9, according to an embodiment of the present invention. More specifically, at least a portion of etch-stop layer 301 that sits on top of source/drain region of transistor 100 may be removed in order to expose silicide contact 104 of source/drain underneath. The removal of the etch-stop layer 301 on top of the source/drain silicide 104 may be made through, for example, a directional etching process such as a process that employs ion or neutral bombardment in a plasma environment. The directional etching process may leave sidewalls of gate 701 continue to be covered by etch-stop layer 301 after the portion thereof on top of silicide 104, in the source/drain region of transistor 100, is removed. After the directional etching, the remaining portion of etch-stop layer 301 may serve to isolate gate 701 from contacting contact 1001 formed later. Alternatively, etch-stop layer 301 may be removed by applying an isotropic etching process such as a RIE etching process or other wet etching process. In situation where etch-stop layer 301 is completely removed by an isotropic etching process, according to one embodiment, thickness of oxide layer 702 shall be sufficiently big or thick such as to extend below the level (or height) of spacer 203, as illustrated in FIG. 10, in order to adequately isolate conductive gate region 701 from contacting subsequently formed contact 1001.

After silicide 104 of source/drain region is exposed, contact 1001 to source/drain of transistor 100 may be formed by filling conductive materials such as, for example, tungsten (W), copper (Cu), or cobalt (Co) in the opening 901. With etch-resistant layer $Al_2O_3$ covering the top surface of replacement gate 701, contact via 1001 may be formed borderless to transistor 100. In instances where a directional etching process is employed in removing etch-stop layer 301, a thin etch-stop layer 301 may still exist between upper portion of sidewalls of gate 701 and contact 1001, and between sidewalls of spacers 203 and contact 1001.

Figures 11, 12:
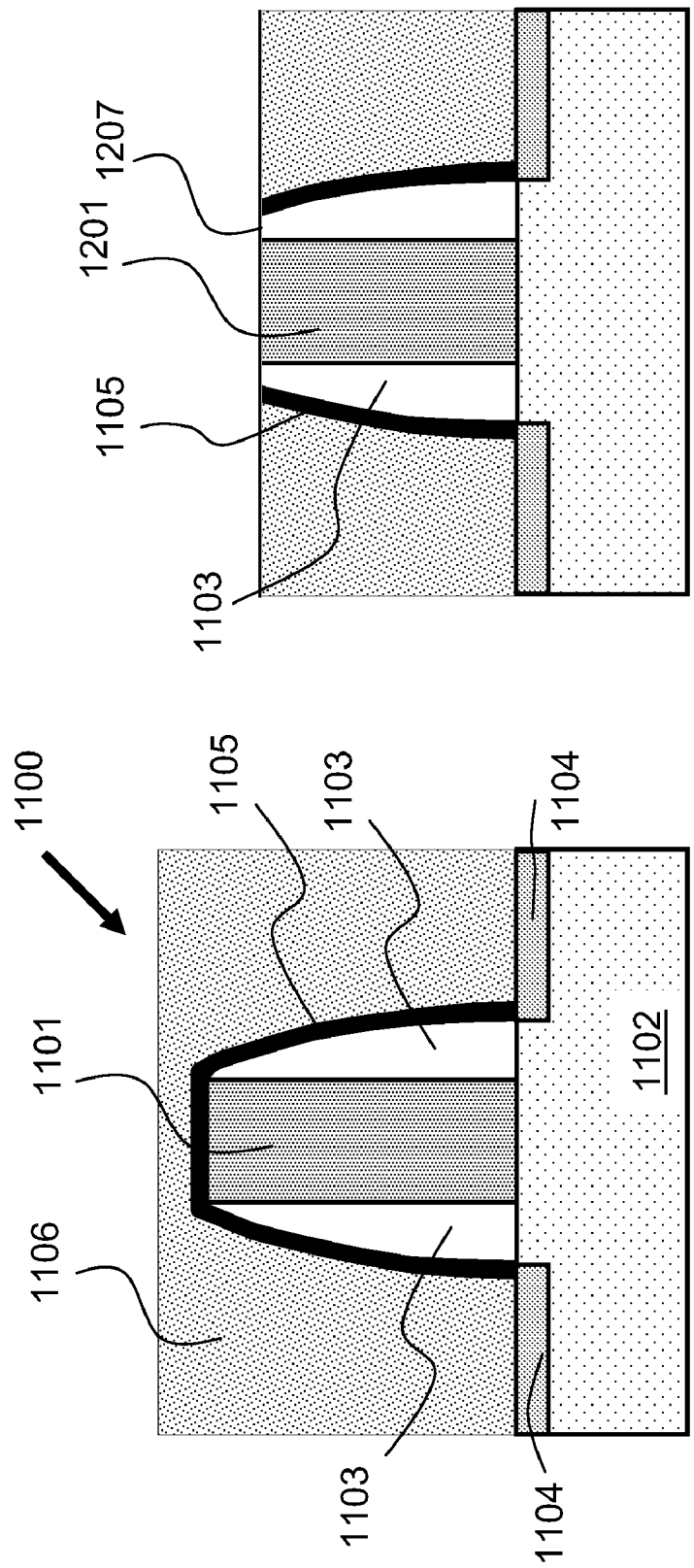
FIG. 11 is a demonstrative illustration of a semiconductor structure during a process of forming borderless contacts for a transistor as is known in the art.
FIG. 12 is a demonstrative illustration of directly applying a replacement metal gate process to the process of forming borderless contacts shown in FIG. 11, as is known in the art.

A person skilled in the art will appreciate that, during the dielectric etching process that creates opening 901, because the pulled-down spacers 203 are fully covered by etch-stop layer 301, integrity of spacers 203 are not compromised. Neither the sidewalls of replacement gate 701 gets eroded during the etching process, achieving what was not possible in the prior art as being described previously with regard to FIG. 11 and FIG. 12.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the spirit of the invention.

What is claimed is:

1. A method comprising:
   forming a gate, on top of a substrate, and spacers adjacent to sidewalls of said gate;
   lowering a height of said spacers to expose an upper portion of said sidewalls of said gate;
   depositing an etch-stop layer covering said height-lowered spacers and said exposed upper portion of said sidewalls of said gate;
   creating an opening at a level above said spacers and within said upper portion of said sidewalls to expose said gate from a top thereof; and
   removing existing gate material of said gate from said opening and replacing with a new gate material to form a replacement gate.

2. The method of claim 1, wherein said creating an opening comprises:
   depositing an inter-level dielectric (ILD) layer covering said height-lowered spacers and at least a portion of said exposed upper portion of said sidewalls of said gate; and
   lowering a top surface of said ILD layer through planarization to said level thereby removing said etch-stop layer from a top surface of said gate and creating said opening.

3. The method claim 2, wherein said ILD layer is a first ILD layer, further comprising:
   depositing a second ILD layer covering said replacement gate and said first ILD layer;
   creating an via opening in said first and second ILD layers, said via opening exposing said etch-stop layer, said etch-stop layer covering said spacers and said upper portion of said sidewalls of said gate;

removing at least a portion of said exposed etch-stop layer that is on top of a source/drain region; and filling said via opening with a metal material forming a metal contact.

4. The method of claim 3, wherein said new gate material is covered by a gate cap layer at a top thereof that protects said replacement gate during the process of said creating said via opening in said first and second ILD layers.

5. The method of claim 4, wherein said gate cap layer is aluminum-oxide, aluminum-nitride, or dielectric material that is different from said second ILD layer.

6. The method of claim 2, wherein said depositing said ILD layer comprises depositing said ILD layer to fully cover said exposed upper portion of said sidewalls and said top surface of said gate through said etch-stop layer.

7. The method of claim 1, wherein said upper portion of said sidewalls of said gate has a range of height between about 5 nm and about 35 nm, representing about 10% to 70% of a total height of said gate, said range of height being adequate for causing said opening to be created at said level above said spacers.

8. The method of claim 1, wherein said lowering a height of said spacers comprises etching said spacers in a reactive-ion-etching (RIE) process, said RIE process being a directional etching process and being selective to said existing gate material of said gate.

9. A method comprising:

forming a dummy gate, on top of a substrate, and a first set of spacers adjacent to sidewalls of said dummy gate;

etching said first set of spacers, selective to material of said dummy gate, to expose an upper portion of said sidewalls of said dummy gate, said etching forming a second set of spacers;

depositing an etch-stop layer covering said second set of spacers and said upper portion of said sidewalls of said dummy gate;

exposing a top surface of said dummy gate at a level above said second set of spacers and within a range of said upper portion of said sidewalls; and replacing said material of said dummy gate with a new gate material thereby forming a replacement gate.

10. The method of claim 9, wherein said exposing a top surface of said dummy gate comprises:

depositing an inter-level dielectric (ILD) layer covering said second set of spacers and at least a portion of said exposed upper portion of said sidewalls of said dummy gate; and planarizing said ILD layer to said level thereby removing said etch-stop layer from said top surface of said dummy gate.

11. The method claim 10, wherein said ILD layer is a first ILD layer, further comprising:

depositing a second ILD layer covering said replacement gate and said first ILD layer;

creating an via opening in said first and second ILD layers, said via opening exposing said etch-stop layer that covers said second set of spacers and said upper portion of said sidewalls of said dummy gate; and filling said via opening with a metal material forming a metal contact.

12. The method of claim 11, wherein said new gate material is made of aluminum.

13. The method of claim 12, wherein said new gate material has a layer of aluminum-oxide at a top thereof that is resistant to the process of said creating said via opening in said first and second ILD layers.

14. The method of claim 13, further comprising forming said aluminum-oxide to have a thickness extending below a top level of said second set of spacers.

15. The method of claim 10, wherein said exposed upper portion of said sidewalls and said top surface of said dummy gate are fully covered by said etch-stop layer and said ILD layer.

16. The method of claim 9, wherein said upper portion of said sidewalls of said gate has a range of height between about 5 nm and about 35 nm, representing about 10% to 70% of a total height of said gate, said range of height being adequate for causing said exposed top surface to be at said level above said second set of spacers.

17. A method of forming a replacement gate of a field-effect-transistor, the method comprising:

forming a dummy gate, on top of a substrate, and a first set of spacers at sidewalls of said dummy gate;

directionally etching said first set of spacers, selective to material of said dummy gate, to expose an upper portion of said sidewalls of said dummy gate, said etching forming a second set of spacers made of height-lowered first set of spacers;

depositing an etch-stop layer covering said second set of spacers, said upper portion of said sidewalls and a top surface of said dummy gate;

exposing said dummy gate from a top thereof at a level above said second set of spacers and within a range of said upper portion of said sidewalls; and replacing said dummy gate with a new gate material thereby forming a replacement gate.

18. The method of claim 17, wherein depositing said etch-stop layer comprises depositing a hafnium-oxide layer to cover said second set of spacers, said upper portion of said sidewalls and a top surface of said dummy gate.

19. The method of claim 17, further comprising, before said exposing said dummy gate, depositing an inter-level dielectric (ILD) layer covering said second set of spacers and at least a portion of said exposed upper portion of said sidewalls of said dummy gate.

20. The method of claim 19, wherein said ILD layer is a first ILD layer, further comprising:

depositing a second ILD layer covering said replacement gate and said first ILD layer;

creating an via opening in said first and second ILD layers, said via opening exposing said etch-stop layer that covers said second set of spacers, said upper portion of said sidewalls of said dummy gate, and a silicide on top of a source/drain region;

removing at least a portion of said etch-stop layer on top of said silicide; and filling said via opening with a metal material forming a metal contact.

* * * * *